(12) United States Patent
Yokota et al.

(10) Patent No.: US 10,451,656 B2
(45) Date of Patent: Oct. 22, 2019

(54) CURRENT SENSOR AND MEASURING APPARATUS

(71) Applicant: HIOKI DENKI KABUSHIKI KAISHA, Nagano (JP)

(72) Inventors: Osamu Yokota, Nagano (JP); Hidekazu Masuda, Nagano (JP)

(73) Assignee: HIOKI DENKI KABUSHIKI KAISHA, Nagano (JP)

( * ) Notice: Subject to any disclaimer, the term of this patent is extended or adjusted under 35 U.S.C. 154(b) by 225 days.

(21) Appl. No.: 15/522,962

(22) PCT Filed: Dec. 15, 2015

(86) PCT No.: PCT/JP2015/084997
§ 371 (c)(1),
(2) Date: Apr. 28, 2017

(87) PCT Pub. No.: WO2016/098750
PCT Pub. Date: Jun. 23, 2016

(65) Prior Publication Data
US 2017/0336443 A1    Nov. 23, 2017

(30) Foreign Application Priority Data
Dec. 17, 2014    (JP) .................................. 2014-255212

(51) Int. Cl.
*G01R 15/14*    (2006.01)
*G01R 15/20*    (2006.01)

(52) U.S. Cl.
CPC ......... *G01R 15/148* (2013.01); *G01R 15/207* (2013.01)

(58) Field of Classification Search
None
See application file for complete search history.

(56) References Cited

U.S. PATENT DOCUMENTS

2010/0264905 A1* 10/2010 Schmitt .................. G01R 33/09
324/126
2017/0115328 A1    4/2017 Seki et al.

FOREIGN PATENT DOCUMENTS

JP    2004-170091    6/2004
JP    2006-46922    2/2006
(Continued)

OTHER PUBLICATIONS

Office Action issued in Japan Counterpart Patent Appl. No. 2014-255212, dated Jul. 10, 2018, along with an English translation thereof.
(Continued)

*Primary Examiner* — Paresh H Patel
(74) *Attorney, Agent, or Firm* — Greenblum & Bernstein, P.L.C.

(57) ABSTRACT

There is provided a ring-shaped magnetic core that forms a closed magnetic circuit that encloses a measured electrical path, a magneto-electric converter that detects magnetic flux inside the magnetic core and outputs an electrical signal with an amplitude in keeping with a quantity of the magnetic flux, a coil that is formed on the magnetic core and is supplied with a negative feedback current generated based on the electrical signal, and an internal shield member disposed at least in a vicinity of the magneto-electric converter and the coil. A first gap that increases a magnetoresistance of a closed magnetic circuit, which is a closed magnetic circuit for leakage flux that leaks from the magnetic core and includes the internal shield member, a part of the magnetic core where the coil is formed, and the magneto-electric converter, is formed in the internal shield member.

8 Claims, 6 Drawing Sheets

(56) References Cited

FOREIGN PATENT DOCUMENTS

JP  2008-275321  11/2008
JP  2012-117839  6/2012

OTHER PUBLICATIONS

Search Report issued in Japan Patent Application No. PCT/JP2015/084997, dated Mar. 1, 2016.
Office Action issued in Japan Counterpart Patent Appl. No. 2014-255212, dated Jan. 15, 2019, along with an English translation thereof.
Office Action issued in China Counterpart Patent Appl. No. 201580067958.5, dated Jan. 29, 2019, along with an English translation thereof.

* cited by examiner

F I G. 1 1
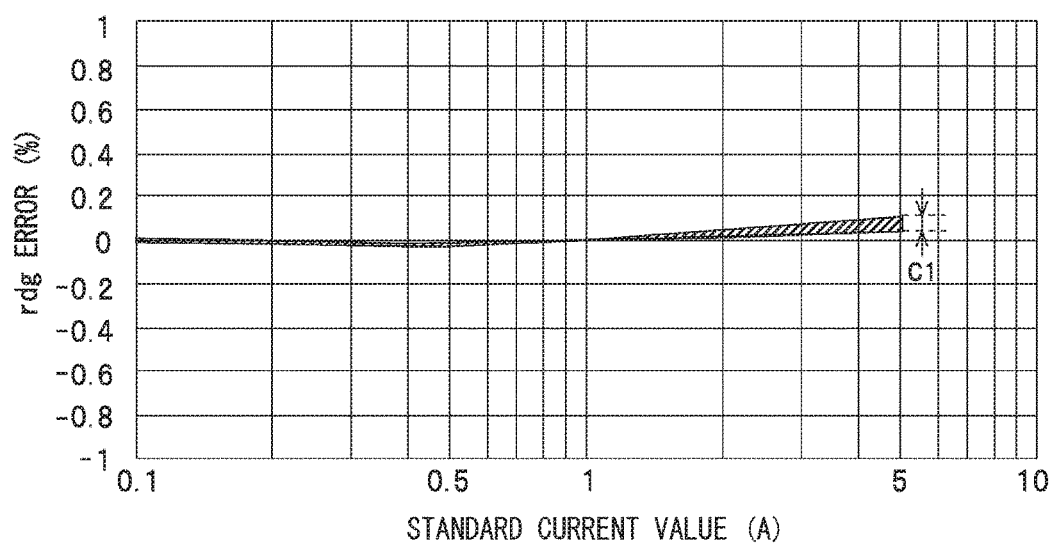
F I G. 1 2
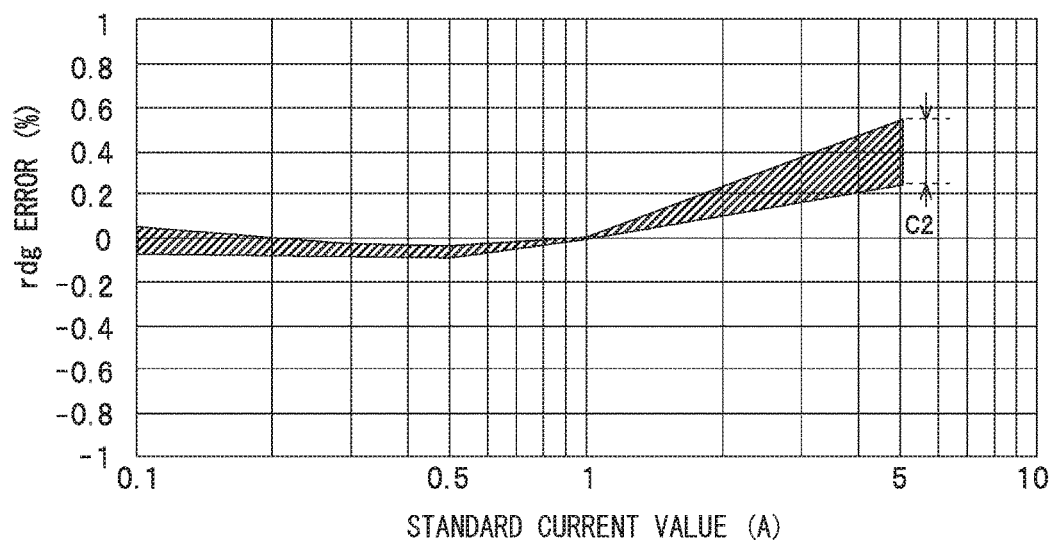

CURRENT SENSOR AND MEASURING APPARATUS

TECHNICAL FIELD

The present invention relates to a current sensor, which is equipped with a magnetic core, a magneto-electric converter such as a Hall element, a coil formed on the magnetic core, and a shield member (such as a shield case) and is configured so that the magnetic core forms a closed magnetic circuit that encloses a measured electrical path, and to a measuring apparatus equipped with such current sensor.

BACKGROUND ART

One example of a current sensor of this type is a current sensor that has already been disclosed by the present applicant in Patent Document 1 indicated below. The current sensor in the cited document has the following basic configuration. The current sensor includes a magnetic core configured so as to be split into a fixed first magnetic core and a movable (openable) second core so that a wire to be measured can be passed through an internal void, and a magnetic shield case (composed of a fixed first magnetic shield case and a movable second magnetic shield case) that covers the magnetic core with the object of shutting out external magnetic fields (external noise). The fixed first magnetic core is open on one side so as to form an approximate U shape, and the movable second magnetic core is supported by the second magnetic shield case and a core opening/closing mechanism so as to be capable of opening and closing the open side of the first magnetic core. The fixed first magnetic core is also provided with a Hall element, which is a magneto-electric converting element, and a negative feedback coil.

The current sensor of the configuration described above functions in combination with an externally provided amplifier as a zero-flux (magnetic equilibrium) measuring apparatus (as one example, a current detecting apparatus). In more detail, this measuring apparatus has the amplifier connected as a voltage-to-current converter to the output of the Hall element and has the output of the amplifier connected to one end of the negative feedback coil. The amplifier generates a negative feedback current that is proportional to the output voltage of the Hall element and supplies the negative feedback current to the negative feedback coil. A detection resistor that detects the negative feedback current as a voltage is connected to the other end of the negative feedback coil.

Here, the negative feedback current is proportional to the magnitude (hereinafter "quantity") of the magnetic flux generated in the magnetic core. That is, the negative feedback current is Proportional to the current flowing in the wire to be measured. Accordingly, this measuring apparatus makes it possible to measure the current flowing in the wire to be measured based on the voltage detected by the detection resistor.

However, as disclosed in Patent Document 1, this current sensor has the following problem to be solved. In a current sensor of this type, the magnetoresistance of a closed magnetic circuit constructed by the magnetic core greatly increases at the part with the negative feedback coil and the part (gap) where the Hall element is disposed. This means that with this current sensor, magnetic flux leaks from these parts toward the magnetic shield case.

With this current sensor, the current flowing in the wire to be measured induces magnetic flux not only in the magnetic core but also in the magnetic shield case (such magnetic flux is sometimes referred to as "induced magnetic flux"), and depending on the magnitudes of the induced magnetic flux and the leakage magnetic flux, magnetic saturation may occur for the magnetic shield case. Note that magnetic saturation hardly occurs for the magnetic core since negative feedback is applied as described above so that the internally generated magnetic flux is zero.

When the current value of the current flowing in the wire to be measured is large and magnetic saturation has occurred for the magnetic shield case, the magnitude (or "quantity") of the magnetic flux inside the magnetic shield case will peak and as a result, the magnitude (or "quantity") of magnetic flux inside the magnetic core will increase by a corresponding quantity. Here, with a zero-flux (magnetic equilibrium) measuring apparatus (current detecting apparatus), the negative feedback current is increased so that the magnetic flux generated in the negative feedback coil increases in keeping with this increase. Accordingly, for the measuring apparatus that uses this current sensor, there is a problem that in a state where the current flowing in the wire to be measured reaches a large current region where magnetic saturation occurs for the magnetic shield case, the detection sensitivity increases (that is, linearity of the detection sensitivity is lost).

Patent Document 1 discloses, as a configuration for improving the problem described above, a configuration where out of the magnetic shield case, the volume of a specified part of the magnetic core where the magneto-electric converter (magneto-electric converting element) and the negative feedback coil are not provided is made larger than other parts (more specifically, an extra magnetic body is stuck onto the magnetic shield case).

PRIOR ART DOCUMENTS

Patent Documents

[Patent Document 1]
Japanese Laid-open Patent Publication No. 2006-46922 (pages 2 to 6 and FIGS. 1 and 5 to 6)

DISCLOSURE OF THE INVENTION

Problem to be Solved by the Invention

However, there is demand for a configuration that is capable of maintaining linearity for detection sensitivity while making it unnecessary to use a separate magnetic body unlike the configuration disclosed in Patent Document 1 mentioned above (a configuration where an extra magnetic body is attached).

The present invention was conceived in view of the problem described above and has a principal object of providing a current sensor capable of maintaining linearity for detection sensitivity and a measuring apparatus that uses this current sensor.

Means for Solving the Problem

To achieve the stated object, a current sensor according to claim 1 comprises a ring-shaped magnetic core that forms a closed magnetic circuit that encloses a measured electrical path; a magneto-electric converter that detects magnetic flux inside the magnetic core and outputs an electrical signal with an amplitude in keeping with a quantity of the magnetic flux; a coil that is formed on the magnetic core and is supplied with a negative feedback current generated based on the electrical signal; and a shield member disposed at least in a vicinity of the magneto-electric converter and the coil, wherein a gap that increases a magnetoresistance of a closed magnetic circuit, which is a closed magnetic circuit for magnetic flux that leaks from the magnetic core and includes the shield member, a part of the magnetic core where the coil is formed, and the magneto-electric converter, is formed in the shield member.

The current sensor according to claim 2 of the current sensor according to claim 1 is characterized in the shield member is constructed in a shape that covers substantially all of the magnetic core, the magneto-electric converter, and the coil.

The current sensor according to claim 3 of the current sensor according to either claim 1 or claim 2 is characterized in the shield member includes an internal shield member, which is constructed so as to cover substantially all of the magnetic core, the magneto-electric converter, and the coil, and an external shield member, which covers substantially all of the internal shield member without contacting the internal shield member, and the gap is formed in only the internal shield member.

The measuring apparatus according to claim 4 comprises the current sensor according to any of claim 1 to claim 3; an amplifier that generates the negative feedback current based on the electrical signal and supplies the negative feedback current to one end of the coil; and a current-to-voltage converting unit that is connected to another end of the coil and convers the negative feedback current to a voltage signal.

Effect of the Invention

With the current sensor according to claim 1 and the measuring apparatus according to claim 4, by providing a gap that increases the magnetoresistance of a closed magnetic circuit, which is a closed magnetic circuit for leakage magnetic flux and includes the magneto-electric converter, in the shield member, it is possible to avoid magnetic saturation of the closed magnetic circuit, even in a high current region where the current value of the measured current flowing on the measured electrical path is high, which means that it is possible to sufficiently maintain favorable linearity.

According to the current sensor according to claim 2 and the measuring apparatus according to claim 4, since the internal shield member is constructed in a shape which, in the closed state, covers substantially all of the magnetic core, the magneto-electric converter, and the coils, it is possible to measure the current value of the measured current flowing on the measured electrical path in a state where the effect of external magnetic fields on the magnetic core, the magneto-electric converter, and the coils has been sufficiently reduced.

Also, according to the current sensor according to claim 3 and the measuring apparatus according to claim 4, by using a doubly shielded construction where the external shield member, which in the closed state almost entirely covers the internal shield member, is disposed outside the internal shield member, it is possible to significantly reduce the effect of external magnetic fields on the magnetic core, the magneto-electric converter, and the coils with the external shield member while providing the first gap in the internal shield member as described above to maintain favorable linearity. Therefore, according to the current sensor and the measuring apparatus, it is possible to measure the current value of the measured current flowing on the measured electrical path with significantly higher accuracy.

BRIEF DESCRIPTION OF DRAWINGS

FIG. 11 is a characteristics graph depicting fluctuations in an rdg error for a measured current I for current sensors 1 constructed of a combination of one second core unit 3 and a plurality of first core units 2.

FIG. 12 is a characteristics graph depicting fluctuations in an rdg error for a measured current I for a current sensor constructed of a combination of one second core unit 3 and a plurality of first core units of a conventional configuration.

BEST MODE FOR CARRYING OUT THE INVENTION

Embodiments of a current sensor and a measuring apparatus will now be described with reference to the attached drawings.

First, the configuration of a current sensor 1 will be described.

Figure 1:
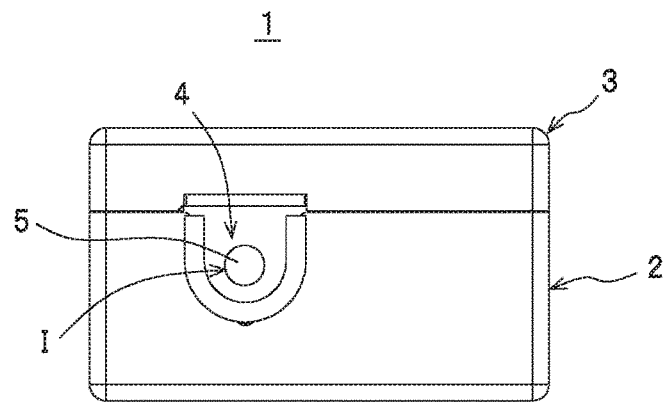
FIG. 1 is a front view of a current sensor 1.
Figure 2:
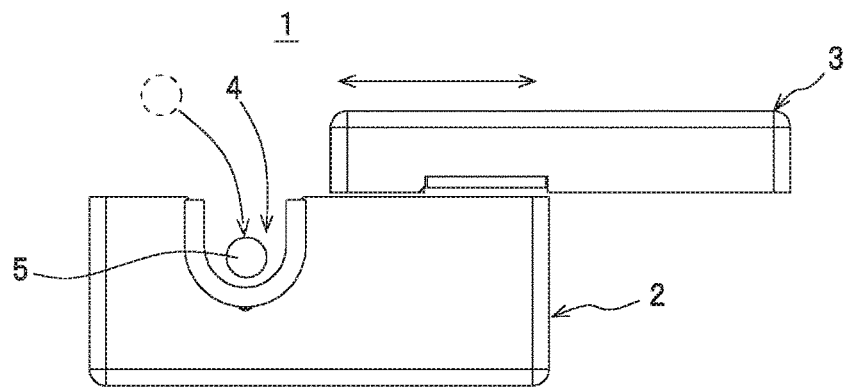
FIG. 2 is a front view of the current sensor 1 in a state where a second core unit 3 has been slid relative to a first core unit 2.
Figure 3:
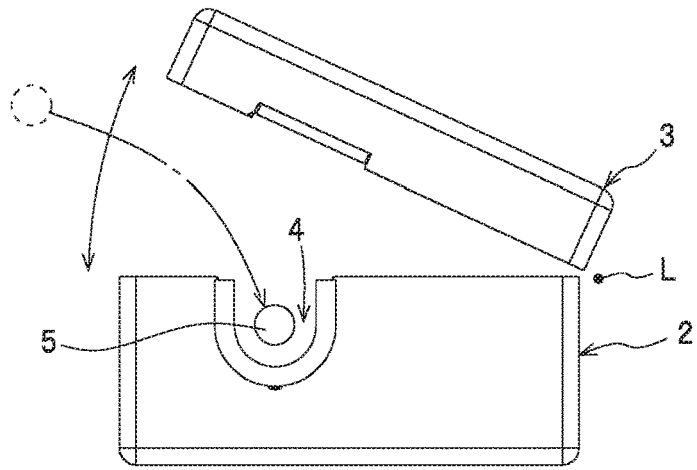
FIG. 3 is a front view of the current sensor 1 in a state where the second core unit 3 has been rotated about a rotational axis L relative to the first core unit 2.

As depicted for example in FIG. 1, the current sensor 1 includes a first core unit 2 and a second core unit 3 that is supported by an opening/closing mechanism, not illustrated, so as to be capable of opening and closing the first core unit 2, and is configured so as to be capable of enclosing (clamping) a measured electrical path 5, which has been introduced into a concave channel (or "window") 4 formed in the first core unit 2, between the core units 2 and 3. Here, regarding the opening/closing mechanism, as depicted in FIG. 2, it is possible to slide (linearly move) the second core unit 3 relative to the first core unit 2 as the opening/closing mechanism, and as depicted in FIG. 3, it is also possible to rotate the second core unit 3 relative to the first core unit 2 about a rotational axis L as the opening/closing mechanism.

Figure 8:
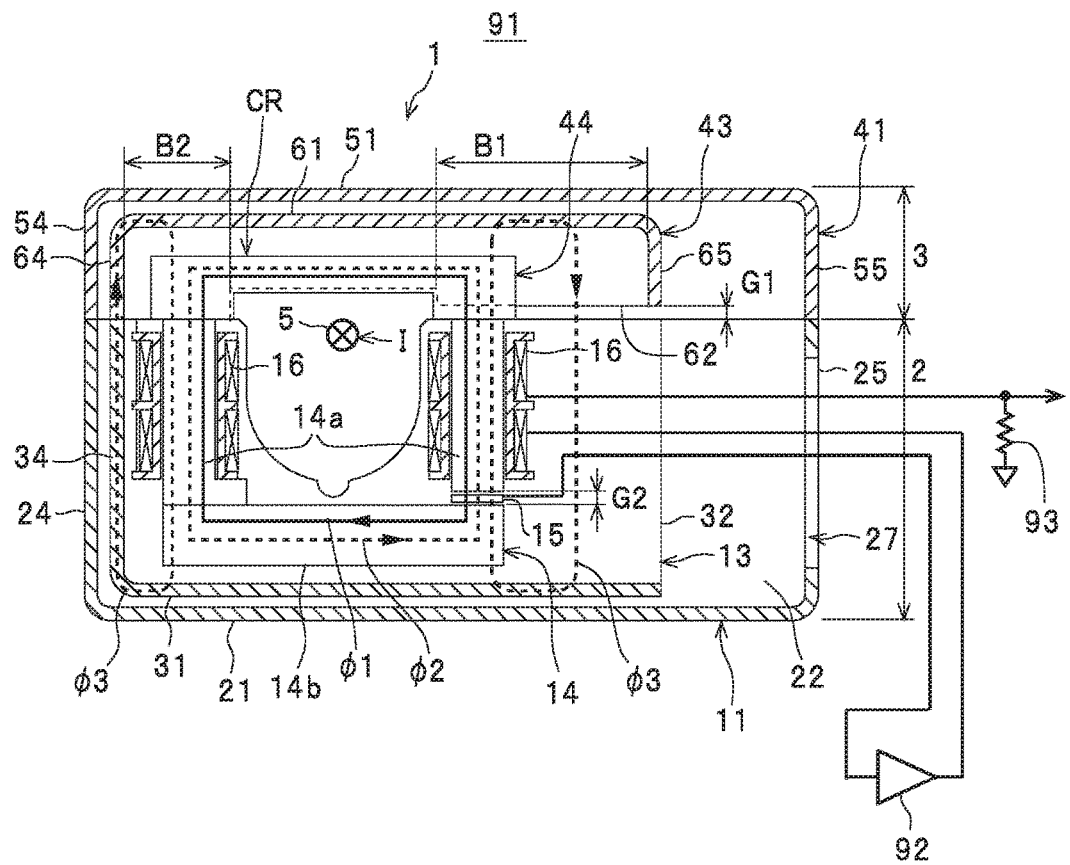
FIG. 8 is a cross-sectional view of the current sensor 1 along a line W1-W1 in FIG. 7 (a cross-sectional view of a state where first holders 12, second holders 42, a first window frame 17, and a second window frame 45 are not illustrated), and a configuration diagram of a current detecting apparatus 91.

As one example, as depicted in FIG. 8, the current sensor 1 according to the present embodiment includes a magneto-electric converter (a Hall element or a flux gate magnetic detecting element) 15 disposed in a second gap G2 provided in a ring-shaped magnetic core CR, and coils (negative feedback coils) 16 formed (i.e., wound around) the magnetic core CR. Also, as described later, although the second gap G2 is formed in a closed magnetic circuit formed by the magnetic core CR (a closed magnetic circuit for magnetic flux generated in the periphery of the measured electrical path 5 by a measured current I flowing on the measured electrical path 5) and has a function of increasing the magnetoresistance of such closed magnetic circuit, it is assumed that the gaps provided in the closed magnetic circuit, including a first gap G1 described later, are intervals of around several millimeters such that strong magnetic coupling is maintained between end surfaces of magnetic bodies that face one another across the gaps.

As depicted in FIG. 8, by being combined with an amplifier 92 and a current-to-voltage converting unit (as one example, a resistor) 93, the current sensor 1 functions as a current detecting apparatus 91 as one example of a "measuring apparatus". More specifically, in the current detecting apparatus 91, the current sensor 1 inputs an electrical signal (voltage signal) outputted from the magneto-electric converter 15 with an amplitude in keeping with the quantity of magnetic flux inside the magnetic core CR into the amplifier 92, the amplifier 92 converts this voltage signal to a current signal (or "negative feedback current") which is supplied to one end of the coils 16, and this current signal is converted to a voltage by the resistor 93 connected between the other end of the coils 16 and ground.

Here, the magneto-electric converter 15 detects a combined magnetic flux ($\varphi 1$-$\varphi 2$) for first magnetic flux $\varphi 1$ produced in the magnetic core CR due to the measured current I flowing on the measured electrical path 5 enclosed by the magnetic core CR (the magnetic core that constructs a closed magnetic circuit for the magnetic flux produced in the periphery of the measured electrical path 5) and second magnetic flux $\varphi 2$ (i.e., magnetic flux in a direction that cancels out the first magnetic flux) produced in the magnetic core CR via the coils 16 by the current signal from the amplifier 92, and outputs a voltage signal with an amplitude in keeping with the quantity of combined magnetic flux ($\varphi 1$-$\varphi 2$). Based on the voltage signal outputted from the magneto-electric converter 15, the amplifier 92 generates a current signal so that the combined magnetic flux ($\varphi 1$-$\varphi 2$) being detected by the magneto-electric converter 15 becomes zero and supplies the current signal to the coils 16. With a zero-flux circuit configuration (also referred to as a "magnetic equilibrium" (or closed loop) configuration), since the current signal from the amplifier 92 is proportional to the measured current I, the measured current I is measured by measuring the converted voltage produced by the resistor 93.

Figure 4:
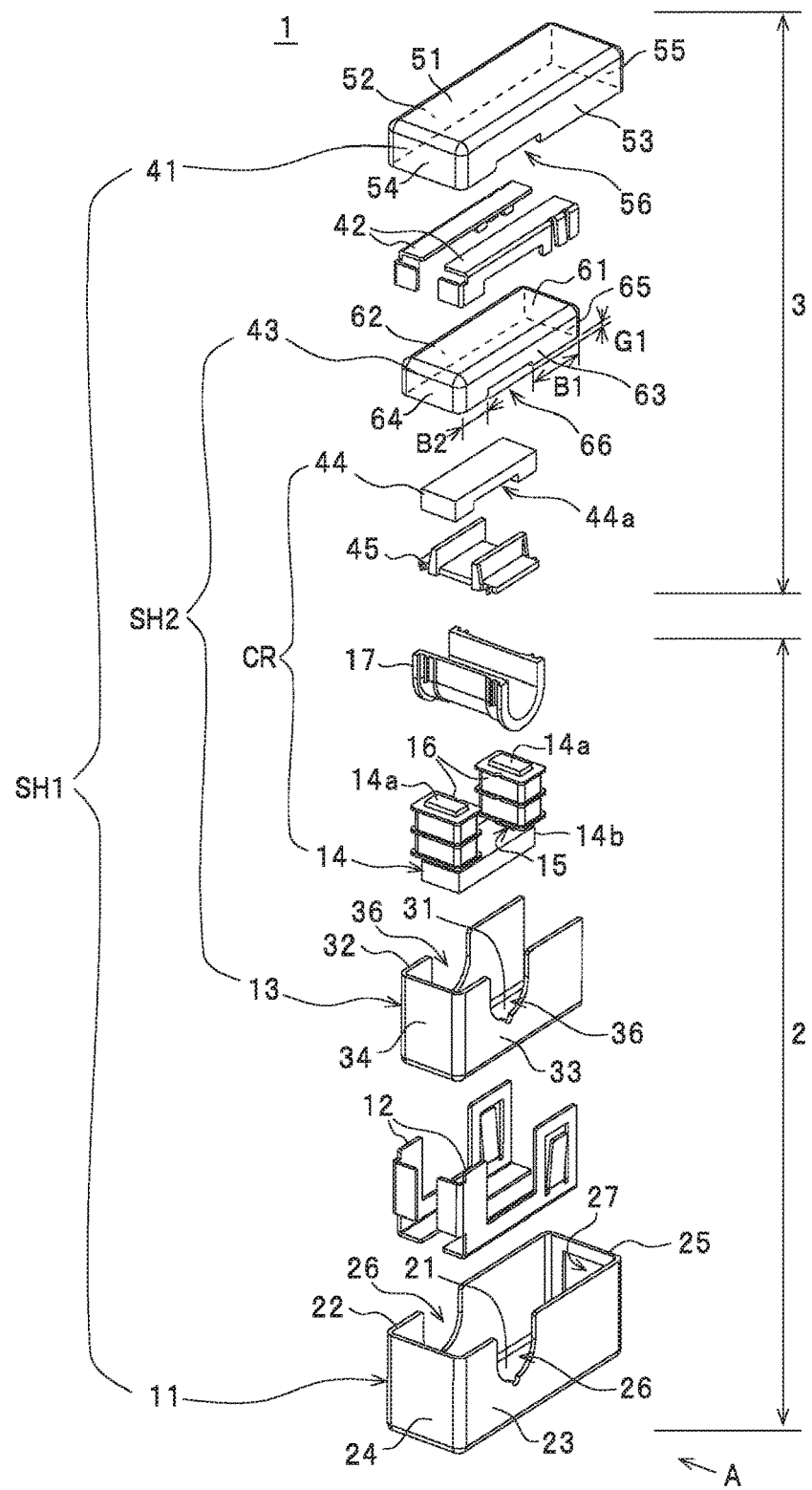
FIG. 4 is an exploded perspective view that is useful in explaining the construction of the current sensor 1.

As depicted in FIG. 4 for example, the first core unit 2 includes a first external shield member 11, first holders 12, a first internal shield member 13, a first core member 14, the magneto-electric converter 15, the coils 16, and a first window frame 17.

The first external shield member 11 is formed using a highly permeable magnetic material, such as permalloy, in a rectangular box shape where a side that faces the second core unit 3 (the upper surface in FIG. 4) is open. More specifically, the first external shield member 11 includes a bottom wall 21 which is rectangular when viewed from above, a pair of side walls 22 and 23 that are erected from a pair of edges (long-side edges) on opposite sides of the bottom wall 21 so as to be parallel, and a pair of side walls 24 and 25 that are erected from a pair of other edges (short-side edges) on opposite sides of the bottom wall 21 so as to be parallel, so as to form the box shape mentioned above.

Cutaway portions 26 whose shapes when viewed from in front correspond to the front shape of the concave channel 4 are formed in the pair of side walls 22 and 23 so as to form openings in the edges of the pair of side walls 22 and 23 that face the second core unit 3 (the upper edges in FIG. 4). Since the cutaway portions 26 are formed in the side walls 22 and 23, the front shape of the first external shield member 11 (i.e., the shape when looking from the direction of the arrow A in FIG. 4) is formed into an approximate U shape so as to be capable of covering the entire first core member 14 whose front is also formed into a U shape as described later. A through-hole 27, to which a circuit board, not illustrated, for leading wiring, not illustrated, relating to the magneto-electric converter 15 out of the first external shield member 11 is attached, is formed in the side wall 25.

The first holders 12 are housed as described later inside the first external shield member 11 together with the first internal shield member 13, and hold the first internal shield member 13 with respect to the first external shield member 11 in a state (or "non-contacting state") where the shield members 11 and 13 do not directly contact each other. The first holders 12 are formed of a non-magnetic material. This means that the shield members 11 and 13 are kept in a state where the magnetic coupling between the shield members is extremely small.

The first internal shield member 13 is formed using the same highly permeable magnetic material as the first external shield member 11 in the shape of a rectangular box whose surface (the upper surface in FIG. 4) that faces the second core unit 3 is open. More specifically, the first internal shield member 13 includes a bottom wall 31 which is rectangular when viewed from above, a pair of side walls 32 and 33 that are erected from a pair of edges (long-side edges) on opposite sides of the bottom wall 31 so as to be parallel, and a side wall 34 that is erected from one edge out of a pair of other edges (short-side edges) of the bottom wall 31, so as to form the box shape described above.

By doing so, the first internal shield member 13 according to the present embodiment uses a configuration where a side wall is not formed on the other edge out of the pair of other opposite edges (short-side edges) of the bottom wall 31, with the wiring described above relating to the magneto-electric converter 15 being led from this part to the outside of the first internal shield member 13. Note that in the same way as the first external shield member 11, it is also possible to use a configuration where a side wall is also provided on this other edge out of the pair of edges (short-side edges) and a through-hole for leading out the wiring described above relating to the magneto-electric converter 15 is formed in this side wall.

Also, cutaway portions 36 whose shapes when viewed from in front correspond to the front shape of the concave channel 4 (i.e., the same shape as the cutaway portions 26) are formed in the pair of side walls 32 and 33 so as to form openings in the edges of the pair of side walls 32 and 33 that face the second core unit 3 (the upper edges in FIG. 4). Since the cutaway portions 36 are formed in the side walls 32 and 33, the front shape of the first internal shield member 13 is formed into an approximate U shape so as to be capable of covering the entire first core member 14 whose front is also formed into a U shape.

The first core member 14 is formed using a highly permeable magnetic material such as ferrite (a magnetic material with lower permeability than the permalloy used for the shield members in the present embodiment) so as to be U shaped when viewed from in front. The coils 16 are provided on two parts 14a (hereinafter respectively referred to as "leg portions 14a") that correspond to the parallel sides of the U shape of the first core member 14. The second gap G2 (see FIG. 8) is formed between a joining part 14b of the first core member 14 that joins the leg portions 14a and one leg portion 14a out of the leg portions 14a (as one example in the present embodiment, the right leg portion 14a when looking from the front), with the magneto-electric converter 15 being disposed inside this second gap G2.

Out of the first external shield member 11, the first holders 12, the first internal shield member 13, and the first core member 14 (the first core member 14 on which the magneto-electric converter 15 and the coil 16 have been disposed as described above and that has been connected to the circuit board and wiring (neither is illustrated) attached to the through-hole 27) of the first core unit 2, the first internal shield member 13 and the pair of first holders 12 are first attached inside the first external shield member 11 in a state where the bottom wall 31, the side wall 32, and the side wall 34 of the first internal shield member 13 are tightly attached to one of the first holders 12 and the bottom wall 31, the side wall 33, and the side wall 34 of the first internal shield member 13 are tightly attached to the other first holder 12.

Next, the first core member 14 is attached inside the first internal shield member 13 in a state where a holder, not illustrated, has been placed in between and a circuit board is attached to the through-hole 27 of the first external shield member 11. After this, by fitting the first window frame 17 into the cutaway portions 26 formed in the first external shield member 11 and the cutaway portions 36 formed in the first internal shield member 13, the first window frame 17 is provided between the leg portions 14a of the first core member 14. Finally, by filling the first external shield member 11 with a potting material (not illustrated) such as epoxy resin and hardening the potting material, the first external shield member 11, the first holder 12, the first internal shield member 13, the first core member 14, and the first window frame 17 are integrated. By doing so, the first core unit 2 with the configuration depicted in FIG. 5 is completed.

Figure 5:
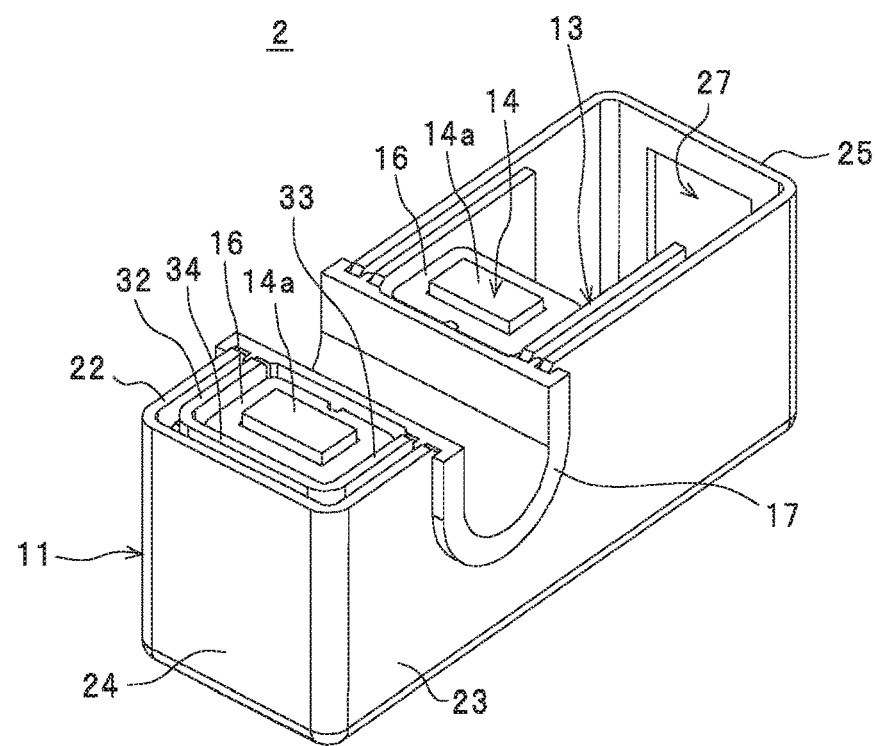
FIG. 5 is a perspective view of the first core unit 2.

With the first core unit 2 constructed in this way, as depicted in FIGS. 5 and 8, edges of the side walls 22, 23, 24, and 25 of the first external shield member 11 that face the second core unit 3 (the upper edges in FIGS. 5 and 8), edges of the side walls 32, 33, and 34 of the first internal shield member 13 that face the second core unit 3 (the upper edges in FIGS. 5 and 8), and end surfaces of the leg portions 14a of the first core member 14 that face the second core unit 3 (the upper surfaces in FIGS. 5 and 8) become positioned on a common plane that is parallel with the bottom wall 21 of the first external shield member 11 and the bottom wall 31 of the first internal shield member 13.

As depicted in FIG. 4 for example, the second core unit 3 includes a second external shield member 41, second holders 42, a second internal shield member 43, a second core member 44, and a second window frame 45.

Together with the first external shield member 11, the second external shield member 41 constructs an external shield member SH1. The second external shield member 41 is formed using the same highly permeable magnetic material as the first external shield member 11 as a rectangular box shape where a side that faces the first core unit 2 (the lower surface in FIG. 4) is open. More specifically, the second external shield member 41 includes a bottom wall 51 which when viewed from above has the same shape as the bottom wall 21 of the first external shield member 11, a pair of side walls 52 and 53 that are erected from a pair of edges (long-side edges) on opposite sides of the bottom wall 51 so as to be parallel, and a pair of side walls 54 and 55 that are erected from a pair of other edges (short-side edges) on opposite sides of the bottom wall 51 so as to be parallel, so as to form the box shape mentioned above.

Although cutaway portions 56 into which the second window frame 45 is fitted are formed in the pair of side walls 54 and 55, the cutaway portions 56 are formed so as to be shallow. This means that the second external shield member 41 is formed so as to be substantially rectangular when viewed from in front.

The second holders 42 are housed inside the second external shield member 41 together with the second internal shield member 43 as described later and hold the second internal shield member 43 with respect to the second external shield member 41 in a state (non-contacting state) where the shield members 41 and 43 do not directly contact each other. The second holders 42 are formed of a non-magnetic material. This means that the shield members 41 and 43 are kept in a state where the magnetic coupling between the shield members is extremely small.

Together with the first internal shield member 13, the second internal shield member 43 constructs an internal shield member SH2. The second internal shield member 43 is formed using the same highly permeable magnetic material as the first external shield member 11 as a rectangular box shape where a side that faces the first core unit 2 (the lower surface in FIG. 4) is open. More specifically, the second internal shield member 43 includes a bottom wall 61 which when viewed from above has the same shape as the bottom wall 31 of the first internal shield member 13, a pair of side walls 62 and 63 that are erected from a pair of edges (long-side edges) on opposite sides of the bottom wall 61 so as to be parallel, and a pair of side walls 64 and 65 that are erected from a pair of other edges (short-side edges) on opposite sides of the bottom wall 61 so as to be parallel, so as to form the box shape mentioned above.

Although cutaway portions 66 into which the second window frame 45 is fitted are formed in the pair of side walls 62 and 63, the cutaway portions 66 are formed so as to be shallow. This means that the second internal shield member 43 is formed so as to be substantially rectangular when viewed from the front. Note that the side wall 65-side parts B1 of the side walls 62 and 63 (that extend to the cutaway portions 66) is formed so that the height from the bottom wall 61 is lower than the side wall 64-side parts B2 of the side walls 62 and 63 (that extend to the cutaway portions 66) by the first gap G1 (as one example in the present embodiment, 500 μm).

The second core member 44 is formed as a rectangular body using the same highly permeable magnetic material as the first core member 14, and, together with the first core member 14 constructs the magnetic core CR. Also, although a concave channel 44a into which the second window frame 45 is fitted is formed in a side of the second core member 44 that faces the first core unit 2 (the lower surface in FIG. 4), the depth of the concave channel 44a is formed shallow at the same depth as the cutaway portions 56 and 66 described above. This means that the second core member 44 is formed in a U shape when viewed from in front.

Out of the second external shield member 41, the second holders 42, the second internal shield member 43, and the second core member 44 of the second core unit 3 described above, the second internal shield member 43 and the pair of second holders 42 are attached inside the second external shield member 41 in a state where the bottom wall 61, the side wall 62, and the side wall 64 of the second internal shield member 43 are tightly attached to one of the second holders 42 and the bottom wall 61, the side wall 63, and the side wall 64 of the second internal shield member 43 are tightly attached to the other second holder 42.

Next, the second core member 44 is attached inside the second internal shield member 43 with a holder, not illustrated, placed in between. After this, the second window frame 45 is fitted into the cutaway portions 56 formed in the second external shield member 41, the cutaway portions 66 formed in the second internal shield member 43, and the concave channel 44a formed in the second core member 44. Finally, by filling the second external shield member 41 with a potting material (not illustrated) such as epoxy resin and hardening the potting material, the second external shield member 41, the second holders 42, the second internal shield member 43, the second core member 44, and the second window frame 45 are integrated. By doing so, the second core unit 3 with the configuration depicted in FIG. 6 is completed.

Figure 6:
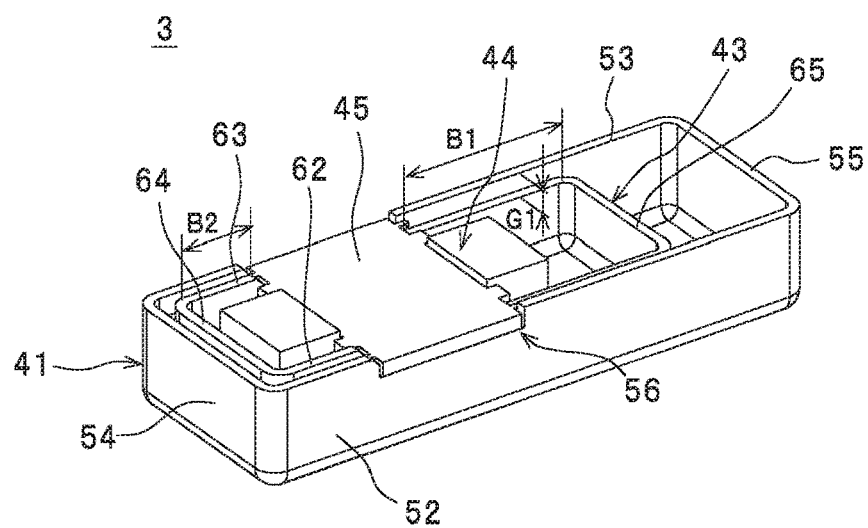
FIG. 6 is a perspective view of the second core unit 3.

With the second core unit 3 constructed in this way, as depicted in FIGS. 6 and 8, edges of the side walls 52, 53, 54, and 55 of the second external shield member 41 that face the first core unit 2 (the upper edges in FIG. 6 and the lower edges in FIG. 8), the edges of the part B2 of the side walls 62 and 63 of the second internal shield member 43 that face the first core unit 2 (the upper edges in FIG. 6 and the lower edges in FIG. 8), the edge of the side wall 64 of the second internal shield member 43 that faces the first core unit 2 (the upper edge in FIG. 6 and the lower edge in FIG. 8), and a part of an end surface (the upper edge in FIG. 6 and the lower edge in FIG. 8) of the second core member 14 that faces the first core unit 2 aside from the concave channel 44a become positioned on a common plane that is parallel with the bottom wall 51 of the second external shield member 41 and the bottom wall 61 of the second internal shield member 43.

On the other hand, edges of the part B1 of the side walls 62 and 63 of the second internal shield member 43 (the upper edges in FIG. 6, the lower edges in FIG. 8) that face the first core unit 2 and an edge of the side wall 65 of the second internal shield member 43 that faces the first core unit 2 (the upper edge in FIG. 6, the lower edge in FIG. 8) become positioned on a different plane (a plane that is the first gap G1 closer to the bottom surface 51) that is parallel to the plane described above where the edges of the side walls 52, 53, 54, and 55 that face the first core unit 2 and the like are positioned.

Next, the operation of the current detecting apparatus 91 equipped with the current sensor 1 will be described.

Figure 7:
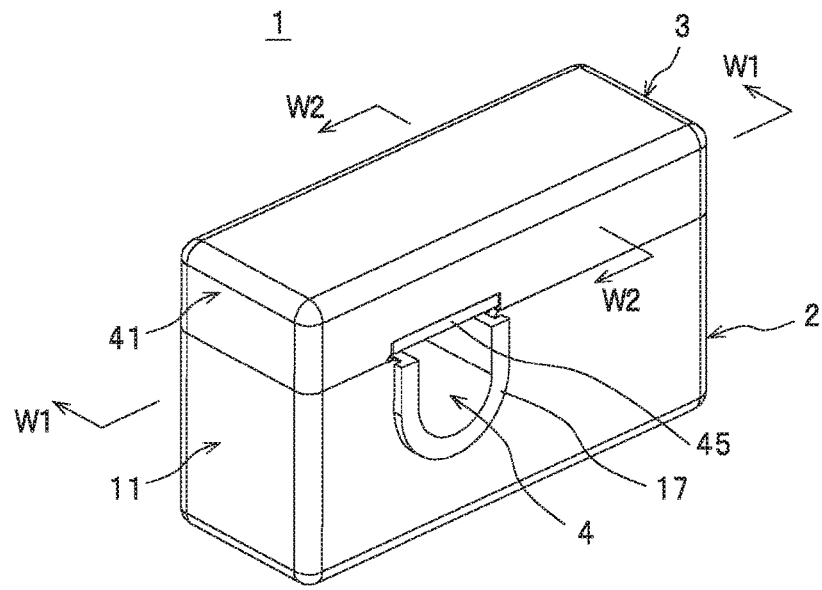
FIG. 7 is a perspective view of the current sensor 1.

First, as depicted in FIGS. 2 and 3, by moving the second core unit 3 relative to the first core unit 2, the current sensor 1 is placed in the open state and the measured electrical path 5 is housed inside the concave channel 4. After this, by moving the second core unit 3 relative to the first core unit 2, the current sensor 1 is placed in the closed state depicted in FIGS. 1 and 7 (note that the measured electrical path 5 has been omitted from FIG. 7).

When the current sensor 1 is in the closed state, the plane where the edges of the side walls 22, 23, 24, and 25 of the first external shield member 11 of the first core unit 2 that face the second core unit 3 and the like are positioned matches the plane where the edges of the side walls 52, 53, 54, and 55 of the second external shield member 41 that face the first core unit 2 and the like are positioned.

This means that the edges of the side walls 22, 23, 24, and 25 of the first external shield member 11 that face the second core unit 3 and the corresponding edges of the side walls 52, 53, 54, and 55 of the second external shield member 41 that face the first core unit 2 (see FIG. 8) contact each other. Also, the edge of the partition wall 34 of the first internal shield member 13 that faces the second core unit 3 and the edge of the side wall 64 of the second internal shield member 43 that faces the first core unit 2 contact each other (see FIG. 8). The end surfaces of the leg portions 14a of the first core member 14 that face the second core unit 3 and the end surface of the first core member 14 that faces the first core unit 2 (the end surface aside from the concave channel 44a) also contact each other (see FIG. 8).

On the other hand, for the edges of the side walls 32 and 33 of the first internal shield member 13 that face the second core unit 3, although parts of the edges of the side walls 32 and 33 that face the part B2 of the side walls 62 and 63 of the second internal shield member 43 contact the edges of this part B2, parts of the edges of the side walls 32 and 33 that face the part B1 of the side walls 62 and 63 of the second internal shield member 43 become separated from the edges of this part B1 by the first gap G1 (see FIG. 8).

In this closed state, with the current sensor 1, the magnetic core CR constructed by the first core member 14 and the second core member 44 forms a closed magnetic circuit that encloses the measured electrical path 5 and the internal shield member SH2 constructed by the first internal shield member 13 and the second internal shield member 43 also forms a closed magnetic circuit that encloses the measured electrical path 5. Note that since almost all of the magnetic flux generated in the periphery of the measured electrical path 5 passes inside the magnetic core CR and the internal shield member SH2, the external shield member SH1 that is constructed of the first external shield member 11 and the second external shield member 41 and covers substantially the entire internal shield member SH2 in a state where there is no contact with the internal shield member SH2 does not effectively form a closed magnetic circuit that encloses the measured electrical path 5.

On the other hand, the internal shield member SH2 that directly covers the magnetic core CR forms a closed magnetic circuit in a state where the first gap G1 is formed as a gap between the first internal shield member 13 and the second internal shield member 43, that is, a state with large magnetoresistance. This means that a closed magnetic circuit formed across the entire internal shield member SH2 (i.e., the closed magnetic circuit formed so as to surround the concave channel 4) which together with the magnetic core CR is directly affected by magnetic flux generated in the periphery of the measured electrical path 5 is not susceptible to magnetic saturation compared to a conventional configuration where the first gap G1 is not formed, even when the current value of the measured current I that flows on the measured electrical path 5 has increased.

Also, as described in the background art section, since the magnetoresistance increases in the current sensor 1 at parts of the magnetic core CR where the coils 16 are formed, as depicted in FIG. 8, leakage flux φ3 that leaks toward the internal shield member SH2 is generated at these formation positions. In the present embodiment, since the coils 16 are formed on both leg portions 14a of the first core member 14, as depicted in FIG. 8, the leakage flux φ3 is generated at both of the leg portions 14a.

Figure 9:
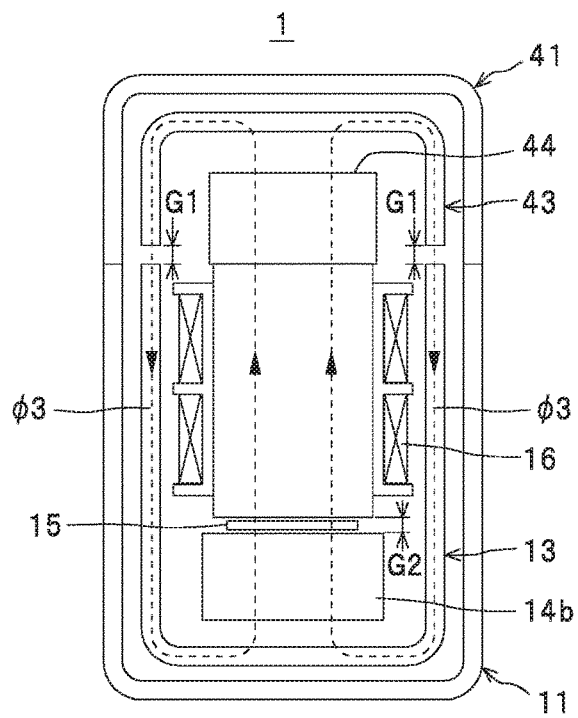
FIG. 9 is a cross-sectional view of the current sensor 1 along a line W2-W2 in FIG. 7 (a cross-sectional view of a state where the first holders 12 and the second holders 42 are not illustrated)

Here, as depicted in FIGS. 8 and 9, the closed magnetic circuit for the leakage flux φ3 at one position out of the two positions with leakage flux φ3 (the leakage flux φ3 on the right in FIG. 8) is formed on a path that extends from one of the leg portions 14a via one end, out of the two ends of the second core member 44, that contacts this leg portion 14a, a part of the internal shield member SH2 that is disposed in the vicinity of this leg portion 14a (parts of the first internal shield member 13 and the second internal shield member 43 in the vicinity of this leg portion 14a), one end, out of the two ends of the joining part 14b, that contacts this leg portion 14a, and the second gap G2 (the magneto-electric converter 15 disposed inside the second gap G2) to reach this leg portion 14a. The closed magnetic circuit for the other leakage flux φ3 (the leakage flux φ3 on the left in FIG. 8) is formed on a path that reaches the other of the leg portions 14a from that leg portion 14a, the end out of the two ends of the joining part 14b that contacts this other leg portion 14a, the part of the internal shield member SH2 disposed in the vicinity of this other leg portion 14a, and the end of the second core member 44 that contacts this other leg portion 14a.

Figure 10:
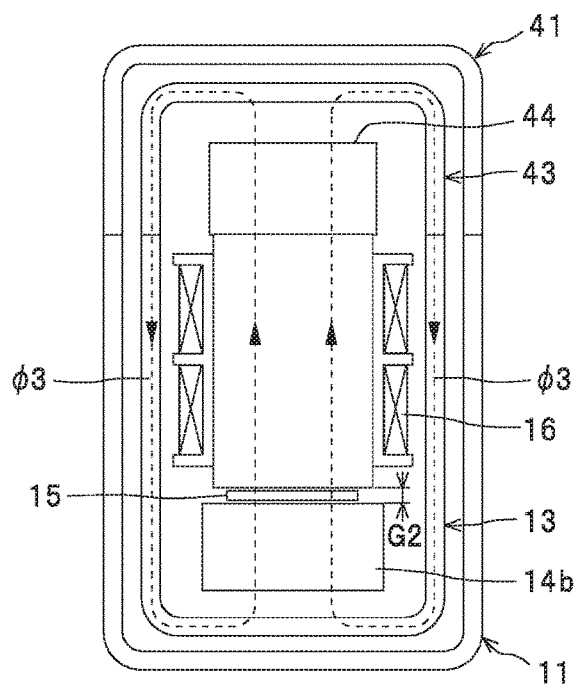
FIG. 10 is a cross-sectional view of a comparative example where the first gap G1 is omitted from FIG. 9.

Here, with the current sensor 1, since the closed magnetic circuit for the other leakage flux φ3 on the left in FIG. 8 is not provided with a magnetic gap, there is the risk of magnetic saturation when the current value of the measured current I has increased. However, as depicted in FIG. 9, the internal shield member SH2 that constructs part of the closed magnetic circuit for the leakage flux φ3 on the right in FIG. 8 (i.e., the closed magnetic circuit where the magneto-electric converter 15 is disposed) is provided with the first gap G1 that increases the magnetoresistance of the closed magnetic circuit. This means that the magnetoresistance of the closed magnetic circuit depicted in FIG. 9 is large compared to the magnetoresistance of a closed magnetic circuit for the leakage flux φ3 (the configuration depicted in FIG. 10) configured so that the configuration in FIG. 9 is not provided with the first gap G1. By doing so, in the same way as the closed magnetic circuit for the magnetic flux generated in the periphery of the measured electrical path 5 described above, magnetic saturation hardly occurs for the other closed magnetic circuit for the leakage flux φ3 (i.e., the closed magnetic circuit where the magneto-electric converter 15 is disposed), even when the current value of the measured current I has increased.

With the current detecting apparatus 91 equipped with the current sensor 1 configured as described above, the magneto-electric converter 15 detects the combined magnetic flux (φ1-φ2) inside the magnetic core CR described above and outputs a voltage signal in keeping with the combined magnetic flux (φ1-φ2). Based on the voltage signal outputted from the magneto-electric converter 15, the amplifier 92 generates a current signal so that the level of the voltage signal becomes zero (that is, so that the combined magnetic flux (φ1-φ2) detected by the magneto-electric converter 15 becomes zero) and supplies the current signal to the coils 16.

Here, when the current value of the measured current I flowing on the measured electrical path 5 enclosed in the magnetic core CR has increased, the quantity of magnetic flux generated in the periphery of the measured electrical path 5 also increases. Here, although the first magnetic flux φ1 inside the magnetic core CR also increases at this time, with the current detecting apparatus 91, the second magnetic flux φ2 is increased in keeping with the increase in the first magnetic flux φ1, so that the combined magnetic flux (φ1-φ2) inside the magnetic core CR is maintained at substantially zero. Accordingly, the magnetic core CR is kept in a non-magnetically saturated state.

On the other hand, for the internal shield member SH2 that forms a closed magnetic circuit that encloses the measured electrical path 5 in the same way as the magnetic core CR, the quantity of magnetic flux of the closed magnetic circuit increases in keeping with an increase in the quantity of magnetic flux generated in the periphery of the measured electrical path 5. Also, in keeping with the increase in the quantity of magnetic flux, the quantity of leakage flux φ3 (magnetic flux directed toward the internal shield member SH2 positioned in the vicinity of the coils 16) at the parts of the magnetic core CR where the respective coils 16 are formed also increases.

Here, once magnetic saturation of the internal shield member SH2 has occurred due to the increase in the quantities of magnetic flux, since the quantity of magnetic flux inside the internal shield member SH2 is limited to a certain quantity, the quantity of magnetic flux inside the magnetic core CR increases (i.e., increases by a quantity of magnetic flux by which the internal shield member SH2 would increase if magnetic saturation did not occur). This means that for a current detecting apparatus equipped with such a current sensor, since the current value of the current signal (negative feedback current) supplied to the coils increases above the current value (or "proper current value") when magnetic saturation has not occurred for the internal shield member SH2, the detection sensitivity increases (that is, there is deterioration in linearity).

However, as described above, the current sensor 1 is configured so that magnetic saturation hardly occurs for the closed magnetic circuit for the magnetic flux generated in the periphery of the measured electrical path 5 or for the closed magnetic circuit for one of the leakage flux φ3 (i.e., the closed magnetic circuit where the magneto-electric converter 15 is disposed), even when the current value of the measured current I has increased (i.e., when the quantity of magnetic flux of the closed magnetic circuit has increased). Accordingly, since a state where the internal shield member SH2 is not magnetically saturated is maintained even when the current value of the measured current I has increased, the current detecting apparatus 91 equipped with this current sensor 1 is capable of detecting the current value of the measured current I in a state where the detection sensitivity is substantially constant (that is, a state with favorable linearity). This operation of the current detecting apparatus 91 was verified as indicated below based on experimental results.

In the experiments, each current sensor 1 composed of a combination of a plurality of first core units 2 fabricated with the same specification and one second core unit 3 were combined as described above with the amplifier 92 and the current-to-voltage converting unit (for example, a resistor) 93 to fabricate a plurality (i.e., the same number as the first core units 2) of current detecting apparatuses 91, the current value (or "standard current value") of the measured current I flowing on the measured electrical path 5 was accurately varied, and fluctuations in the rdg error (measurement error) in the current value actually measured by each current detecting apparatus 91 for each standard current value were measured. The experimental results are depicted in FIG. 11. Here, the expression "rdg error" is such that the actually measured current value for the standard current value X (in amps) with an rdg error of Y (%) is given as "X+X×Y/100".

Also, in FIG. 11 (and in FIG. 12 described below), the rdg error when the standard current value is 1 A is set as a standard rdg error of zero and the rdg error for other standard current values (or "differences from the standard rdg error") are indicated for each current value measured by the current detecting apparatus 91. As one example, when the rdg error for the standard current value 0.1 A of the current value measured by one current detecting apparatus is 2.851%, the rdg error for 0.5 A is 2.822%, the rdg error for 1.0 A is 2.8446%, and the rdg error for 5.0 A is 2.954%, in FIG. 11 the rdg error for the standard current value 0.1 A is expressed as 0.0064 (=2.851−2.8446), the rdg error for the standard current value 0.5 A is expressed as −0.0226(=2.822−2.8446), the rdg error for the standard current value 1.0 A is expressed as 0 (=2.8446−2.8446), and the rdg error for the standard current value 5.0 A is expressed as 0.1094(=2.954−2.8446).

In FIG. 11, the region that is diagonally shaded indicates a range where the rdg errors in the current value measured by the respective current detecting apparatuses 91 at each standard current value are present, and the width of the region that is diagonally shaded at each standard current value indicates fluctuations present in the rdg value of the measured current value. As one example, in FIG. 11, when the standard current value is 5 A where the width of the fluctuation in the rdg error is largest, the rdg errors in the current value actually measured by the respective current detecting apparatuses are included in a region of the width C1 (a region with a minimum value of 0.04 and a maximum value of 0.11), indicating that there is fluctuation with a width C1 of 0.07 (=0.11−0.04).

Also, in FIG. 11, the magnitude of the difference between the largest value out of the maximum values of the rdg errors at the standard current values and the smallest value out of the minimum values of the rdg errors at the standard current values indicates the linearity of current measurement by the current detecting apparatus 91. This means that the linearity of the current detecting apparatus 91 equipped with the current sensor 1 maintains sufficiently favorable linearity in a range where the standard current value is in a range of 0.1 A to 5 A compared to a comparative example of a current detecting apparatus described later and depicted in FIG. 12.

On the other hand, as a comparative example, a second core unit with the same specification as the second core unit 3 of the current sensor 1 described above was fabricated for a configuration (the configuration depicted in FIG. 10) where the first gap G1 of the internal shield member SH2 is eliminated (i.e., set at zero), and the same experiments were conducted using this second core unit. The experimental results are depicted in FIG. 12. In FIG. 12 also, the region that is diagonally shaded indicates a range where the rdg error in the current value measured by each current detecting apparatus at each standard current value is present and the width of the region that is diagonally shaded at each standard current value indicates fluctuations present in the rdg value of the measured current value. As one example, in FIG. 12, when the standard current value is 5 A where the width of the fluctuation in the rdg error is largest, the rdg errors in the current value actually measured by the respective current detecting apparatuses are included in a region of the width C2 (a region with a minimum value of 0.24 and a maximum value of 0.53), indicating that there is fluctuation with a width C2 of 0.29 (=0.53−0.24).

In FIG. 12, in the same way as in FIG. 11 described above, the magnitude of the difference between the largest value out of the maximum values of the rdg errors at the standard current values and the smallest value out of the minimum values of the rdg errors at the standard current values indicates the linearity of current measurement by the current detecting apparatus. This means that it was confirmed that the linearity of the current detecting apparatus equipped with this current sensor (i.e., a current sensor configured with no first gap G1) deteriorates much more in the range where the standard current value is 0.1 A to 5 A than the current detecting apparatus 91 depicted in FIG. 11.

In this way, according to the current sensor 1 and the current detecting apparatus 91 equipped with the current sensor 1, by providing the internal shield member SH2 with the first gap G1 that increases the magnetoresistance of the closed magnetic circuit that includes the magneto-electric converter 15 and is the closed magnetic circuit for the leakage flux φ3, it is possible to maintain extremely favorable linearity for a low current region (in the present embodiment, the region from 0.1 A to 1 A) for the standard current value where linearity somewhat deteriorates for a current detecting apparatus that uses the current sensor according to the comparative example, and to maintain sufficiently favorable linearity due to the avoidance of magnetic saturation of the closed magnetic circuit even in a high current region where the standard current value is high (in the present embodiment, the region from 1 A to 5 A) where there is large deterioration in linearity for a current detecting apparatus that uses the current sensor according to the comparative example.

According to the current sensor 1 and the current detecting apparatus 91, compared to the current detecting apparatus that uses the current sensor according to the comparative example, it is possible to greatly reduce the fluctuation in the rdg error across an entire region from a low current region to a high current region. Also, with the current sensor 1 and the current detecting apparatus 91, as depicted in FIG. 11, there is a large reduction in fluctuation in the rdg error with a configuration that is a combination of one second core unit 3 and a plurality of first core units 2 that are fabricated with the same specification but have mechanical fluctuations within tolerated ranges for machining precision and assembly precision between the components. Therefore, according to the current sensor 1 and the current detecting apparatus 91, even if the core units 2 and 3 become mechanically displaced when one second core unit 3 is opened and closed on one first core unit 2, it is possible to greatly reduce fluctuations in the current value of the measured current I to be measured that are caused by such mechanical fluctuations (that is, it is possible to improve the reproducibility of measurement).

According to the current sensor 1 and the current detecting apparatus 91, since the internal shield member SH2 is constructed in a shape which, in the closed state, covers substantially all of the magnetic core CR, the magneto-electric converter 15, and the coils 16, it is possible to measure the current value of the measured current I flowing on the measured electrical path 5 in a state where the effect of external magnetic fields on the magnetic core CR, the magneto-electric converter 15, and the coils 16 has been sufficiently reduced.

Also, according to the current sensor 1 and the current detecting apparatus 91, by using a doubly shielded construction where the external shield member SH1, which in the closed state almost entirely covers the internal shield member SH2, is disposed outside the internal shield member SH2, it is possible to significantly reduce the effect of external magnetic fields on the magnetic core CR, the magneto-electric converter 15, and the coils 16 with the external shield member SH1 while providing the first gap G1 in the internal shield member SH2 as described above to maintain favorable linearity. Therefore, according to the current sensor 1 and the current detecting apparatus 91, it is possible to measure the current value of the measured current I flowing on the measured electrical path 5 with significantly higher accuracy.

Note that although the first gap G1 is formed at a coupled part near the magneto-electric converter 15 out of the coupled part (i.e., magnetically coupled part) of the first internal shield member 13 and the second internal shield member 43 that construct the internal shield member SH2 in the above description due to ease of formation, the formation position of the first gap G1 is not limited to this position and so long as the formation position is a location where it is possible to increase the magnetoresistance of the closed magnetic circuit for the leakage flux φ3 (i.e., the closed magnetic circuit that includes the magneto-electric converter 15), it is possible to use a configuration where the first internal shield member 13 is divided and the first gap G1 is formed in the first internal shield member 13 and/or where the second internal shield member 43 is divided and the first gap G1 is formed in the second internal shield member 43. Also, although the number of first gaps G1 is one in the example described above, the present invention is not limited to this and a plurality of first gaps G1 may be provided.

INDUSTRIAL APPLICABILITY

The present invention can be widely applied to current sensors with a ring-shaped magnetic core that forms a closed magnetic circuit that encloses a measured electrical path and to measuring apparatuses equipped with such current sensor.

REFERENCE NUMERALS

1 Current sensor
5 Measured electrical path
15 Magneto-electric converter
16 Coil
CR Magnetic core
G1 First gap
SH1 External shield member
SH2 Internal shield member

The invention claimed is:

1. A current sensor comprising:
   a ring-shaped magnetic core that forms a first closed magnetic circuit that encloses a measured electrical path;
   a magneto-electric converter that detects magnetic flux inside the magnetic core and outputs an electrical signal with an amplitude in keeping with a quantity of the magnetic flux;
   a coil that is formed on the magnetic core and is supplied with a negative feedback current generated based on the electrical signal; and
   a shield that is formed separately from the magnetic core and is disposed in a vicinity of the magnetic core, the magneto-electric converter and the coil,
   wherein a gap that increases a magnetoresistance of a second closed magnetic circuit, which is a closed magnetic circuit for magnetic flux that leaks from the magnetic core and includes the shield, a part of the magnetic core where the coil is formed, and the magneto-electric converter, is formed in the shield.

2. The current sensor according to claim 1, wherein the shield is constructed in a shape that covers substantially all of the magnetic core, the magneto-electric converter, and the coil.

3. The current sensor according to claim 1,
   wherein the shield includes an internal shield, which is constructed so as to cover substantially all of the magnetic core, the magneto-electric converter, and the coil, and an external shield, which covers substantially all of the internal shield without contacting the internal shield, and
   the gap is formed in only the internal shield.

4. A measuring apparatus comprising:
   the current sensor according to claim 1;
   an amplifier that generates the negative feedback current based on the electrical signal and supplies the negative feedback current to one end of the coil; and
   a current-to-voltage converter that is connected to another end of the coil and converts the negative feedback current to a voltage signal.

5. The current sensor according to claim 2,
   wherein the shield includes an internal shield, which is constructed so as to cover substantially all of the magnetic core, the magneto-electric converter, and the coil, and an external shield, which covers substantially all of the internal shield without contacting the internal shield, and
   the gap is formed in only the internal shield.

6. A measuring apparatus comprising:
   the current sensor according to claim 2;
   an amplifier that generates the negative feedback current based on the electrical signal and supplies the negative feedback current to one end of the coil; and
   a current-to-voltage converter that is connected to another end of the coil and converts the negative feedback current to a voltage signal.

7. A measuring apparatus comprising:
   the current sensor according to claim 3;
   an amplifier that generates the negative feedback current based on the electrical signal and supplies the negative feedback current to one end of the coil; and
   a current-to-voltage converter that is connected to another end of the coil and converts the negative feedback current to a voltage signal.

8. A measuring apparatus comprising:
   the current sensor according to claim 5;
   an amplifier that generates the negative feedback current based on the electrical signal and supplies the negative feedback current to one end of the coil; and
   a current-to-voltage converter that is connected to another end of the coil and converts the negative feedback current to a voltage signal.

* * * * *